United States Patent [19]

Davidson et al.

[11] Patent Number: 5,216,580

[45] Date of Patent: Jun. 1, 1993

[54] OPTIMIZED INTEGRAL HEAT PIPE AND ELECTRONIC CIRCUIT MODULE ARRANGEMENT

[75] Inventors: Howard L. Davidson, San Carlos; Ehsan Ettehadieh, Albany; John Schulte, Mountain View, all of Calif.

[73] Assignee: Sun Microsystems, Inc., Mountain View, Calif.

[21] Appl. No.: 820,569

[22] Filed: Jan. 14, 1992

[51] Int. Cl.⁵ .................................................. H05K 7/20
[52] U.S. Cl. ........................... 361/385; 165/104.33; 174/15.2; 257/715
[58] Field of Search .................. 174/15.2; 62/418; 361/385, 382; 357/82; 165/80.4, 80.5, 104.23, 104.26, 104.33

[56] References Cited

U.S. PATENT DOCUMENTS

| | | | |
|---|---|---|---|
| 4,019,098 | 4/1977 | McCready et al. | 361/385 |
| 4,407,198 | 9/1977 | Sekhon | 357/82 |
| 4,833,567 | 5/1989 | Saaski | 361/385 |
| 4,995,451 | 2/1991 | Hamburgen | 165/104.33 |
| 5,095,404 | 3/1992 | Chao | 361/385 |

*Primary Examiner*—Gerald P. Tolin
*Attorney, Agent, or Firm*—Blakely Sokoloff Taylor & Zafman

[57] ABSTRACT

An optimized integral heat pipe and electronic circuit module arrangement is described. A ceramic multi-chip module bearing electronic circuit components has applied to the side opposite the electronic circuit components preparatory metallization and a thermal wick. A heat pipe evaporator chamber and condenser assembly is attached to the multi-chip module and wick assembly. A suitable working fluid is introduced into the vapor chamber and the vapor chamber hermetically sealed. Application of the thermal wick to the heat producing multi-chip module eliminates the thermal impedance contributed by thermal transmission media used in prior art heat pipe assemblies, permitting a doubling of heat flux from the multi-chip module to the heat pipe evaporator.

5 Claims, 4 Drawing Sheets

FIG_1A
(PRIOR ART)
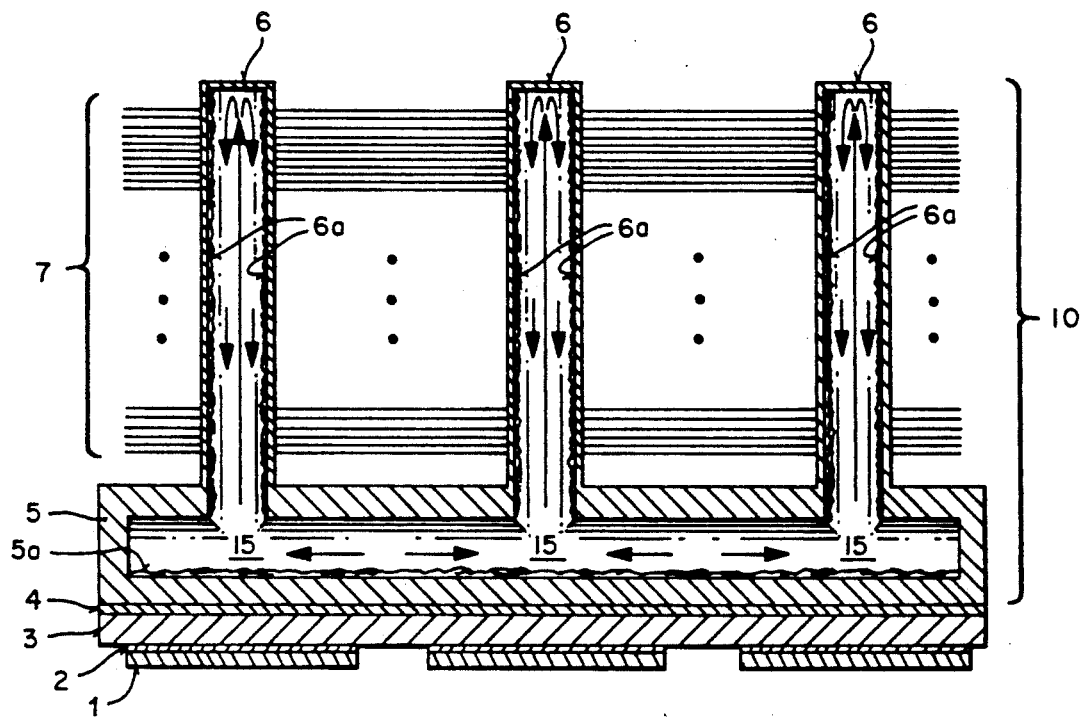
FIG_1B
(PRIOR ART)
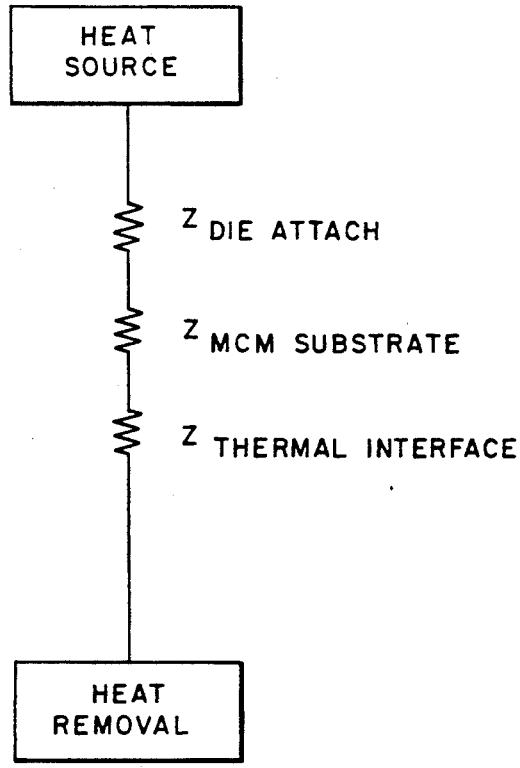

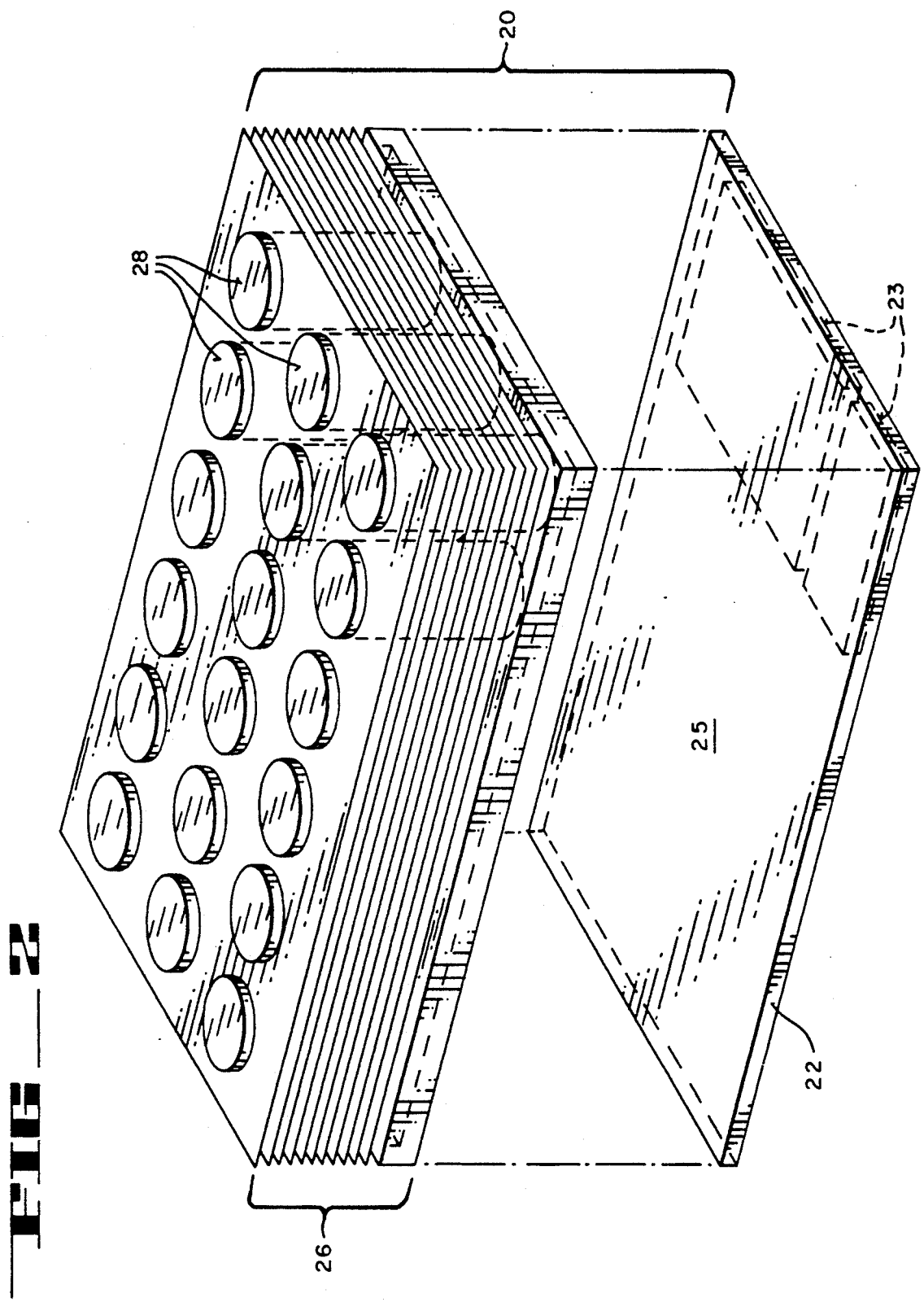

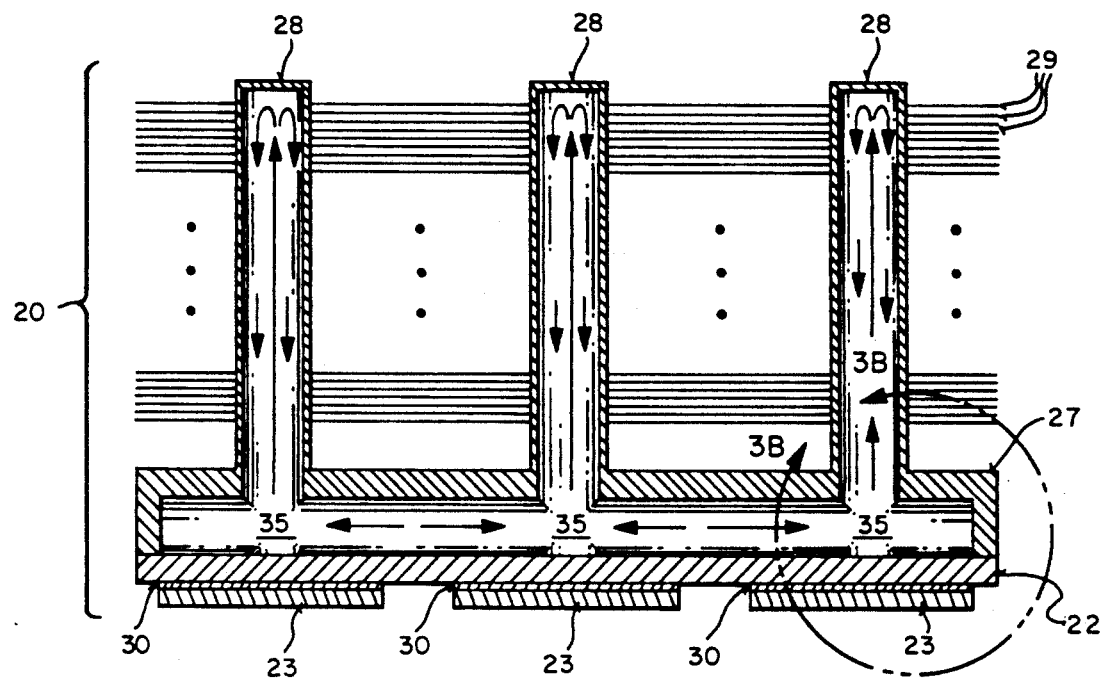
FIG_3A
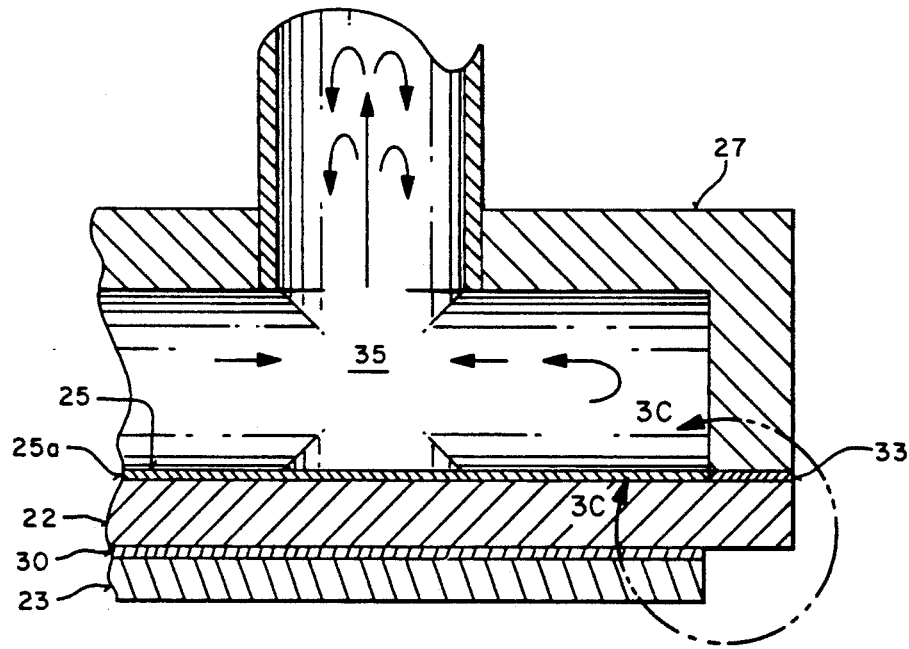
FIG_3B

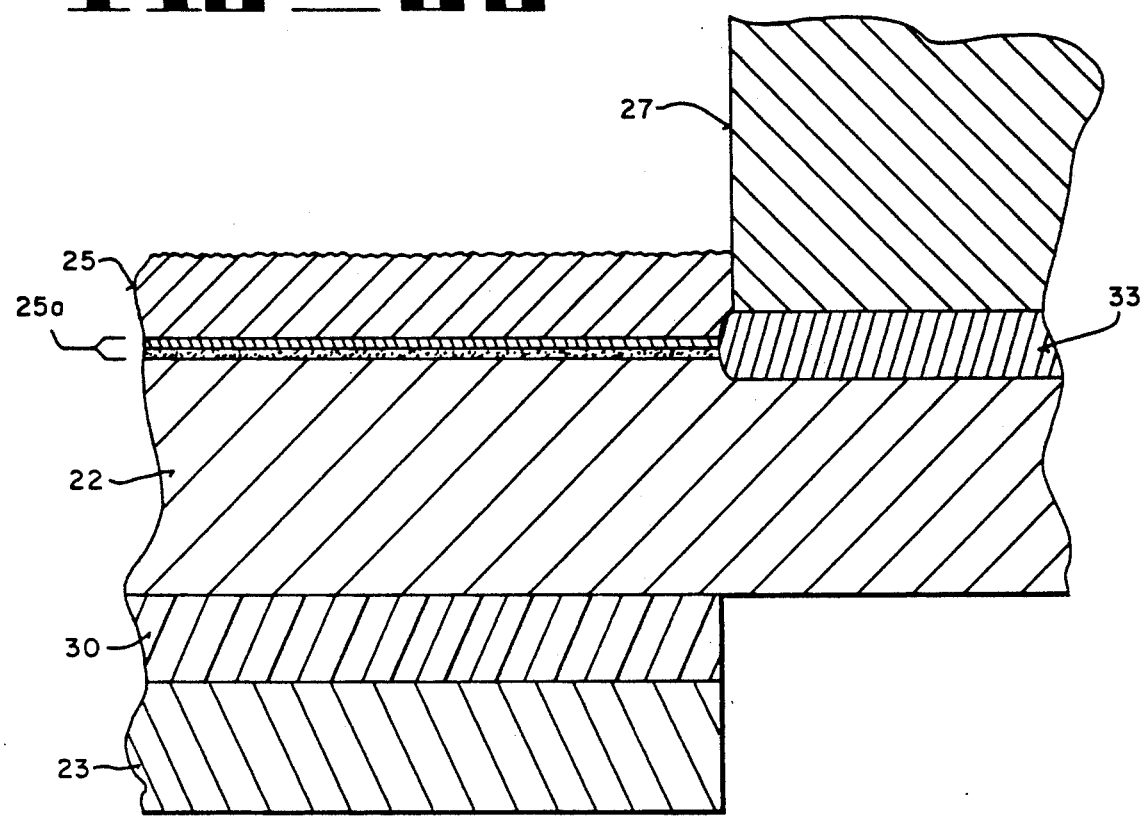
FIG_3C
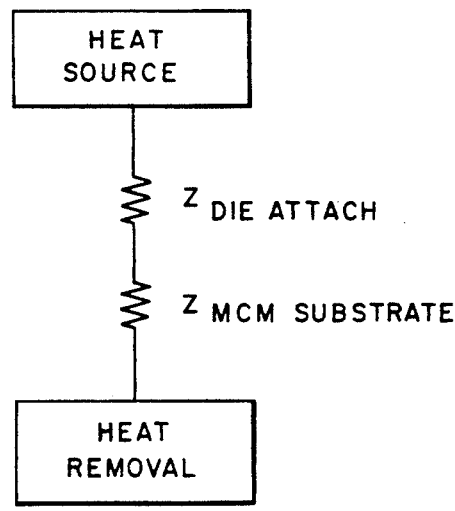
FIG_3D

OPTIMIZED INTEGRAL HEAT PIPE AND ELECTRONIC CIRCUIT MODULE ARRANGEMENT

BACKGROUND OF THE INVENTION

1. Field of the Invention

The present invention relates to heat transfer and cooling arrangements, and more particularly relates to high efficiency optimized heat transfer arrangements for high heat flux applications.

2. Art Background

The use of heat pipes in isothermal surface temperature heat transfer applications is well documented. Heat pipes were first identified in the 1940's as being highly efficient heat transfer mechanisms, and were later optimized during the late 1960's and 1970's in connection with heat transfer problems on board spacecrafts. The operation of a heat pipe as set out above is well known, wherein a working fluid contained within an evacuated vapor chamber fabricated of metallic or other high heat conduction material is caused to boil locally due to some heat flux sourced by a heated object in intimate contact with the heat pipe. The vaporized working fluid molecules then stream rapidly away from the heated region, and are condensed on cooler condenser surfaces some distance away. The condensed working fluid is then returned to the heated region via an applied wick along which the condensed working fluid moves under capillary action. A very rapid and efficient vaporization and condensation cycle is possible, increasing the heat flux and heat transfer capabilities of a heat pipe many orders of magnitude above simple conduction, even that of a high conductivity metal such as copper. A principal benefit of heat pipes is that surface temperatures of heated objects may be isothermally maintained to better than 1° C. for reasonable power densities.

Presently, heat pipe assemblies consist of self-contained units including vapor chamber, condensing tubes, and heat exchange surfaces such as fins attached to the condenser tubes. As shown in FIG. 1A, a prior art heat pump assembly is shown having an evaporator 5 to which are attached condenser tubes 6, and fins 7. Evaporator 5 has a thermal wick 5a applied to it in a known manner. Similarly, a wick material 6a is applied to the interior surfaces of condenser tubes 6. Air is evacuated and an inert working fluid 15 is hermetically sealed within an interior volume within evaporator 5 and condenser tubes 6. The working fluid is caused to undergo an evaporation-condensation cycle according to heat input to evaporator 5 by a heated body. Thus fabricated, the heat pipe assembly is clamped, welded, or otherwise brought into intimate physical and thermal contact with electronic circuit module 3. In cases where clamping is used to attach heat pipe assembly to a heated object, a heat transfer medium must be applied at the interface of the heated object and the heat pipe assembly. The foregoing is true even in cases where objects, which under ordinary circumstances would be considered flat, in fact have sufficient surface topography variations to prevent adequate contact area, and thereby prevent efficient conduction from the heated object to the heat pipe evaporator. Accordingly, a thermal transmission medium 4 is disposed between the circuit module 3 and the evaporator 5. Electronic circuit elements 1 are attached to circuit module 3 with appropriate die-attach material 2, as known in the prior art. Thermal transmission medium 4 contributes a characteristic thermal impedance to the overall thermal impedance of the entire assembly, adding to the thermal impedances of the heat pipe evaporator 5 and heated circuit module 3 to be cooled by the heat pipe assembly. Referring briefly to FIG. 1B, a model thermal resistance network is illustrated for the heat pipe assembly shown in FIG. 1A. Thermal impedances contributed by component parts of the heat pipe including the circuit module 3 are seen to be additive, producing a total thermal impedance resisting the thermal gradient through which heat is to be removed by the condenser tubes 6 and fins 7.

The magnitude of the thermal impedance contributed by the thermal transmission medium 4 (e.g., heat transfer grease) has heretofore been inconsequential, especially in heat transfer applications where the heat transfer surface area is large, or where the heat transfer application is particularly efficient due to liquid cooling, low heat fluxes, etc. However, in recent years certain heat transfer applications have become increasingly critical, wherein heated objects to be cooled have become extremely small and yet produce high power densities and heat fluxes. Examples of such small but powerful objects might include extremely high current computation electronics, or perhaps military radar or other instrumentation systems. In such high-powered and compact arrangements, the thermal transmission medium 4 used to attach the heat-producing body (in this case, the electronic circuit module 3) contributes a thermal impedance which is no longer insignificant to overall thermal impedance of the system; rather, the thermal interface presented by thermal transmission medium 4 contributes a substantial if not controlling degree of thermal impedance, thereby limiting the heat transfer performance of the overall system. In critical applications where the thermal transmission medium 4 used to enhance contact surface area between a heated object and a heat pipe is a substantial or dominant contributor to the total thermal impedance of the system, it is desirable to eliminate such thermal interface entirely in order to enhance the heat transfer performance of the cooling system.

As will be set out in the following description, the present invention provides methods and apparatus for eliminating entirely the thermal tansmission medium interface in heat pipe heat transfer applications, thereby permitting the construction of extremely efficient optimized heat pipe heat transfer arrangements for size and power density crucial applications.

SUMMARY OF THE INVENTION

Methods and apparatus for an optimized integral heat pipe and electronic circuit module arrangements are disclosed. In the preferred embodiment, a multichip module having electronic circuit components attached to one side has applied to the side opposite the electronic circuit components preparatory metallization, after which a sintered wick is applied. Following completed assembly of the multichip module and associated electronic testing, a heat pipe evaporator vapor chamber and condenser assembly is attached to the multichip module and wick assembly, whereafter the vapor chamber is evacuated. Finally, an appropriate amount of suitable working fluid is introduced into the vapor chamber and the vapor chamber hermetically sealed. Thus constructed, the thermal interfaces existing between the heat source and the heat pipe assembly evaporator region are minimized in the present invention by the application of the thermal wick to the heat producing multichip module. In the preferred embodiment, heat flux from the multichip module to the heat pipe is doubled.

BRIEF DESCRIPTION OF THE DRAWINGS

The present invention will be understood more fully from the detailed description given below and from the accompanying drawings of the preferred embodiment of the invention in which:

FIG. 1A illustrates a prior art heat pipe and heat producing body assembly having a thermal interface.

FIG. 1B illustrates a model thermal impedance for the assembly shown in FIG. 1A.

FIG. 2 illustrates the optimized heat producing body and heat pipe assembly of the present invention.

FIG. 3A a side elevation view of the optimized heat pipe assembly of the present invention.

FIG. 3B is an enlarged side elevation view of the heat pipe assembly shown in FIG. 3A.

FIG. 3C is an enlarged side elevation view of the heat pipe assembly shown in FIG. 3B, illustrating the thermal wick applied directly to the electronic circuit module.

FIG. 3D illustrates the thermal impedance for the optimized heat pipe assembly of the present invention.

DETAILED DESCRIPTION OF THE INVENTION

Methods and apparatus for an optimized integral heat pipe and electronic multichip circuit module are disclosed. In the following detailed description of the preferred embodiment, for purposes of explanation, specific numbers, power densities, heat transfer coefficients etc., may be set forth in order to provide a thorough understanding of the present invention. However, it will be apparent to one skilled in the art that the present invention may be practiced without these specific details. In other instances, well known devices are shown in block diagram form in order not to obscure the present invention unnecessarily.

Referring to FIG. 2, an integral heat pipe and electronic circuit module 20 is shown. The integral heat pipe and electronic circuit module 20 consists of a multichip module substrate 22 to which are mounted a number of electronic circuit elements 23. Electronic circuit elements 23 are interconnected via a multiplicity of electrical pathways (not shown) applied in a known manner. On the surface of multichip module substrate 22 opposite the side to which are mounted electronic circuit elements 23 is applied a wick structure 25. Materials which may be applied as wick 25 are varied according to the circumstances the application encountered, including type of working fluid and the surface to which the wick material is to be applied. However, because it is anticipated that the multichip modules utilized in the embodiment of the present invention will incorporate high-powered chips, the material used to fabricate multichip module substrate 22 is a ceramic, such as aluminum oxide or aluminum nitride. In cases where a ceramic such as aluminum nitride is used for multichip module substrate 22, prior to application of the wick material 25 it will be necessary to pretreat the surface which is to receive the wick material with a base or primer-layer 25a. In the preferred embodiment of the present invention, the wick material 25 consists of sintered copper. Accordingly, it is first necessary to "prime" the wick side of multichip module substrate 22 by applying primer-layer 25a consisting of materials to which sintered copper will readily adhere. In the presently preferred embodiment, primer-layer 25a consists of a first layer of titanium followed by a second layer of high purity copper. Both materials may be applied, for example, by evaporation or sputtering. It should be noted that the wick structure 25 together with the primer-layer 25a are applied at any time prior or subsequent to applying the electronic circuit elements 23 and electrically conducting pathways to the multichip module 22. Whether the wick 25 is applied prior or subsequent to fabrication of the electronic components to multichip module substrate 22 depends on the severity of the process environment in which the wick 25 is applied. Where the application process of wick 25 would expose electronic components 23 to a severe or harmful environment, wick 25 together with the primer-layer 25a should be applied prior to the attachment of electronic devices to multichip modules substrate 22, and thereafter be protected during the electronic assembly of multichip module substrate 22 with a suitable protective layer such as adhesive tape or wax.

Once all the electronic circuit components 23 have been attached to multichip module substrate 22, substrate 22 may now be mated with a combined evaporator/condenser unit 26. Evaporator/condenser unit 26 is formed according to the prior art and consists of an evaporator portion 27, condenser tubes 28, and a plurality of horizontally extending fins 29. Condenser tubes 28 have a wick material (not shown) applied to the internal bore, similar to wick 25 applied to substrate 22. It is anticipated that evaporator/condenser unit 26 would be prefabricated in accordance with the requirements of the particular application in which it is to be used, and would be attached only after fabrication and testing of the multichip module 22 is complete. It should be noted at this point that the benefit in the present invention lies in the elimination of the thermal interface which previously existed in prior art heat pipe assemblies wherein a separate heat pipe assembly was attached to the heat producing body, in this case a multichip electronic circuit module. As can be seen in FIG. 2, multichip module substrate 22 receives the evaporator/condenser unit 26 directly, without any intervening interface. Whereas in prior art heat pipe arrangements, wherein the thermal wick (5a, FIG. 1A) is applied to the backside of the heat pipe evaporator (5, FIG. 1A), and then subsequently clamped to the heat producing body, in the present invention the thermal wick 25 is applied directly to the heat producing body, namely multichip module substrate 22. Elimination of the thermal grease interface contributed by thermal transmission medium 4 (as illustrated in FIG. 1 above) enables a substantial reduction in junction temperature in the present embodiment due to the reduced overall thermal impedance of the heat pipe electronic circuit module combination 20 shown in FIG. 2. The present invention will yield particular benefits in operating environments where particular constraints such as heat flux, surface area, total power, etc., place the overall system at the extreme limits of its heat transfer capability. In particular, the overall thermal impedance of heat pipe electronic circuit module combination 20 can be reduced fifty percent simply by the elimination of thermal interface contributed by thermal transmission medium 4 shown in FIG. 1.

Having positioned the evaporator/condenser unit 26 in the appropriate position adjacent to multichip module 22, evaporator/condenser unit 26 is sealed to multichip module 22 using any of several known methods of providing leak-tight seals, including seam welding, cold welding, soldering or brazing. Thereafter, a small amount of an appropriate inert working fluid such as water is introduced into the vapor chamber formed in the interior volume of multichip module substrate 22 and evaporator 27, whereafter the vapor chamber finally is hermetically sealed. Cold welding is especially desirable in the preferred embodiment because it does not induce any temperature cycle induced thermal stress into the seal and the interface formed between multichip module substrate 22 and the evaporator portion 27 of the evaporator/condenser unit 26. Alternatively, commercially available seam welders are capable of producing nearly perfect welded seams, ensuring the integrity of the hermetic seal compared to the seam obtained with a cold weld process.

Referring now to FIG. 3A, a side elevation view of the multichip module substrate 22 mated to evaporator/condenser unit 26 is shown. In FIG. 3A, it is further shown that the evaporation and condensation cycle of the working fluid 35 occurs as close to the heat producing electronic circuit components as is physically possible without actually immersing the electronic circuit components into the working fluid environment. Thus, the overall thermal impedance of the integral heat pipe electronic circuit module unit 20 consists only of the thermal impedance contributed by the die-attach material 30 between electronic circuit component 23 and multichip module substrate 22, and the thermal impedance contributed by the ceramic material of multichip module substrate 22 itself. In FIG. 3B, an enlarged view of a portion of FIG. 3A is shown. In FIG. 3B, multichip module substrate 22 is shown attached to evaporator 27 at the periphery of substrate 22 via a bonding agent 33. As previously mentioned, the preferred embodiment will employ a welded or brazed material for bonding agent 33 to attain a leak-tight seal.

Further, as shown in FIG. 3C, a magnified view of a portion of FIG. 3B is seen, wherein evaporator 27 is bonded to multichip module substrate 22 via appropriate bonding agent 33, and wherein wick 25 is attached to multichip module substrate 22 via two-layer primer-layer 25a.

Analogous to the thermal impedance model shown in FIG. 1B above, the equivalent model thermal impedance for the optimized integral heat pipe electronic circuit module unit of the present invention is shown in FIG. 3D. Relative to the impedance model shown in FIG. 1B, it is easily seen in FIG. 3D that the overall thermal impedance achieved in the present invention's elimination of the thermal transmission medium 4 as well as the thermal impedance of the copper evaporator 5 shown in FIG. 1A contributes substantially to the improved thermal performance of the present invention illustrated in FIGS. 2, 3A-C. It will be appreciated by those skilled in the art that the fifty percent reduction in thermal impedance in the preferred embodiment of the present invention permits, in effect, a doubling in the thermal efficiency and heat transfer capability over that achieved with a prior art heat pipe assembly illustrated in FIG. 1A.

Although the multichip substrate 22 of the present invention has been described herein as being formed of aluminum oxide or aluminum nitride, for higher heat flux or higher total power heat transfer applications it is anticipated that alternative materials may be substituted in place of aluminum nitride or aluminum oxide. For example, beryllium oxide or diamond substrates could be used to form multichip modules substrate 22, thereby providing thermal conductivity increases of 150% to 2000% relative to aluminum nitride. Appropriate alterations in primer-layer 25a would of course be necessary in order to achieve high quality adhesion of the sintered copper wick 25 to the alternative substrate material. Moreover, thermal impedances resulting from the electronic circuit components 23 and the die-attach material 30 can be minimized by reducing the thickness of the silicon substrate of electronic components 23. Suitable methods for reducing the thickness of the electronic components' silicon substrate would include abrasively removing excess silicon, including for example lapping the silicon to twenty percent of the original thickness, thereby rendering the bottom surface of the silicon optically flat. Such extremely flat surfaces could be subsequently attached to multichip module substrate 22 using conventional bonding techniques including adhesive, and yet obtain superior heat conduction from the heat-producing electronic components 23 to multichip module substrate 22.

The foregoing has described an optimized heat pipe in an electronic circuit module arrangement. It is contemplated that changes and modifications may be made by one of ordinary skill in the art to the materials and arrangements of the elements of the present invention without departing from the spirit and scope of the invention.

We claim:

1. An optimized integral heat pipe and electronic circuit assembly comprising:
    a thermally conductive multichip circuit module having top and bottom surfaces and a periphery, said multichip circuit module including a multiplicity of heat producing electronic circuit elements mounted to said bottom surface;
    heat pipe means hermetically coupled to and enclosing the top surface of said multichip circuit module, said heat pipe means enclosing a working fluid for generating an evaporated working fluid vapor when said heat pipe means receives heat produced by said heat producing electronic circuit elements;
    a layer of titanium adhered to and extending substantially over the top surface of said multichip module;
    a layer of high-purity copper adhered to and extending substantially over said layer of titanium;
    a thermal wick adhered to and extending substantially over said layer of high-purity copper, said thermal wick drawing said working fluid to a heated region of said multichip circuit module.

2. The assembly as set forth in claim 1, wherein said thermal wick comprises sintered copper.

3. The assembly as set forth in claim 1, wherein said thermally conductive multichip module comprises aluminum oxide.

4. The assembly as set forth in claim 1, wherein said thermally conductive multichip module comprises aluminum nitride.

5. An optimized integral heat pipe and electronic circuit assembly comprising:
    a thermally conductive multichip circuit module having top and bottom surfaces and a periphery, said multichip circuit module including a multiplicity of heat producing electronic circuit elements mounted to said bottom surface, said multichip module comprising diamond;

heat pipe means hermetically coupled to and enclosing the top surface of said multichip circuit module, said heat pipe means enclosing a working fluid for generating an evaporated working fluid vapor when said heat pipe means receives heat produced by said heat producing electronic circuit elements;

a primer layer adhered to and extending substantially over the top surface of said multichip module;

a thermal wick adhered to and extending substantially over said primer layer, said thermal wick drawing said working fluid to a heated region of said multichip circuit module; wherein said thermal wick comprises sintered copper.

* * * * *